(12) United States Patent
Shinohara (10) Patent No.: US 11,728,803 B2
(45) Date of Patent: Aug. 15, 2023

(54) MULTICHANNEL SWITCH INTEGRATED CIRCUIT

(71) Applicants: Kabushiki Kaisha Toshiba, Tokyo (JP); Toshiba Electronic Devices & Storage Corporation, Tokyo (JP)

(72) Inventor: Masatoshi Shinohara, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 17/583,980

(22) Filed: Jan. 25, 2022

(65) Prior Publication Data
US 2023/0028530 A1 Jan. 26, 2023

(30) Foreign Application Priority Data

Jul. 20, 2021 (JP) ................................. 2021-119568

(51) Int. Cl.
| | |
|---|---|
| *H03K 17/082* | (2006.01) |
| *H03K 17/74* | (2006.01) |
| *H03K 17/687* | (2006.01) |
| *G01R 31/30* | (2006.01) |

(52) U.S. Cl.
CPC ..... *H03K 17/0822* (2013.01); *G01R 31/3004* (2013.01); *H03K 17/687* (2013.01); *H03K 17/74* (2013.01); *H03K 2217/0027* (2013.01)

(58) Field of Classification Search
None
See application file for complete search history.

(56) References Cited

U.S. PATENT DOCUMENTS

| | | |
|---|---|---|
| 5,404,099 A | 4/1995 | Sahara |
| 8,879,226 B2 | 11/2014 | Esumi et al. |
| 9,671,455 B2 * | 6/2017 | Kawasaki .......... G01R 31/2856 |

FOREIGN PATENT DOCUMENTS

| | | |
|---|---|---|
| JP | H05-291368 A | 11/1993 |
| JP | 3024214 B2 | 3/2000 |
| JP | 2007-141882 A | 6/2007 |
| JP | 4168558 B2 | 10/2008 |
| JP | 2009-207077 A | 9/2009 |
| JP | 2012-090108 A | 5/2012 |

* cited by examiner

*Primary Examiner* — Kenneth B Wells
(74) *Attorney, Agent, or Firm* — Allen & Overy LLP (57) ABSTRACT

According to one embodiment, a multichannel switch integrated circuit (IC) includes a multichannel switch circuit and a common test terminal. The multichannel switch circuit includes a plurality of switch circuitries. Each of the switch circuitries includes: an output transistor that outputs an output signal through an output terminal; an overcurrent detection circuit that detects a detection current according to a current flowing through the output transistor; and a diode having an anode that receives the detection current. The common test terminal is connected to each channel switch circuitry, connected to the overcurrent detection circuit through the diode, and connected to a cathode of the diode.

8 Claims, 9 Drawing Sheets

"prior art"

MULTICHANNEL SWITCH INTEGRATED CIRCUIT

CROSS REFERENCE TO RELATED APPLICATION

This application is based upon and claims the benefit of priority from the prior Japanese Patent Application No. 2021-119568, filed on Jul. 20, 2021, the entire contents of which are incorporated herein by reference.

FIELD

The embodiments described herein relate to a multichannel switch integrated circuit.

BACKGROUND

A switch integrated circuit (IC) is applied for industrial and consumer use, and includes an output transistor, a controller, a driver, and the like. The switch ICs are mounted in a motor control system, a battery monitoring system, a power management system, a lighting control system, and the like, and the number of channels has been increasing in recent years.

Overcurrent detection and overheat detection are important for multichannel switch ICs. A protection function circuit that detects overcurrent and overheat prevents abnormal operation of the switch IC, destruction of applications, and the like. Since the protection function circuit is provided with test terminals for each channel, there is a problem that the number of test terminals is increased.

For a multichannel switch IC with a protection function circuit, it is strongly required to reduce the number of test terminals in consideration of the increase in chip size and complexity of testing.

DETAILED DESCRIPTION

According to one embodiment, a multichannel switch integrated circuit (IC) includes a multichannel switch circuit and a common test terminal. The multichannel switch circuit includes a plurality of switch circuitries. Each of the switch circuitries includes an output transistor that outputs an output signal through an output terminal, an overcurrent detection circuit that detects a detection current according to a current flowing through the output transistor and a diode having an anode that receives the detection current. The common test terminal is connected to each channel switch circuitry, connected to the overcurrent detection circuit through the diode, and connected to a cathode of the diode.

A plurality of further embodiments will be described below with reference to the drawings. In the drawings, the same reference numerals denote the same or similar portions.

Figure 1:
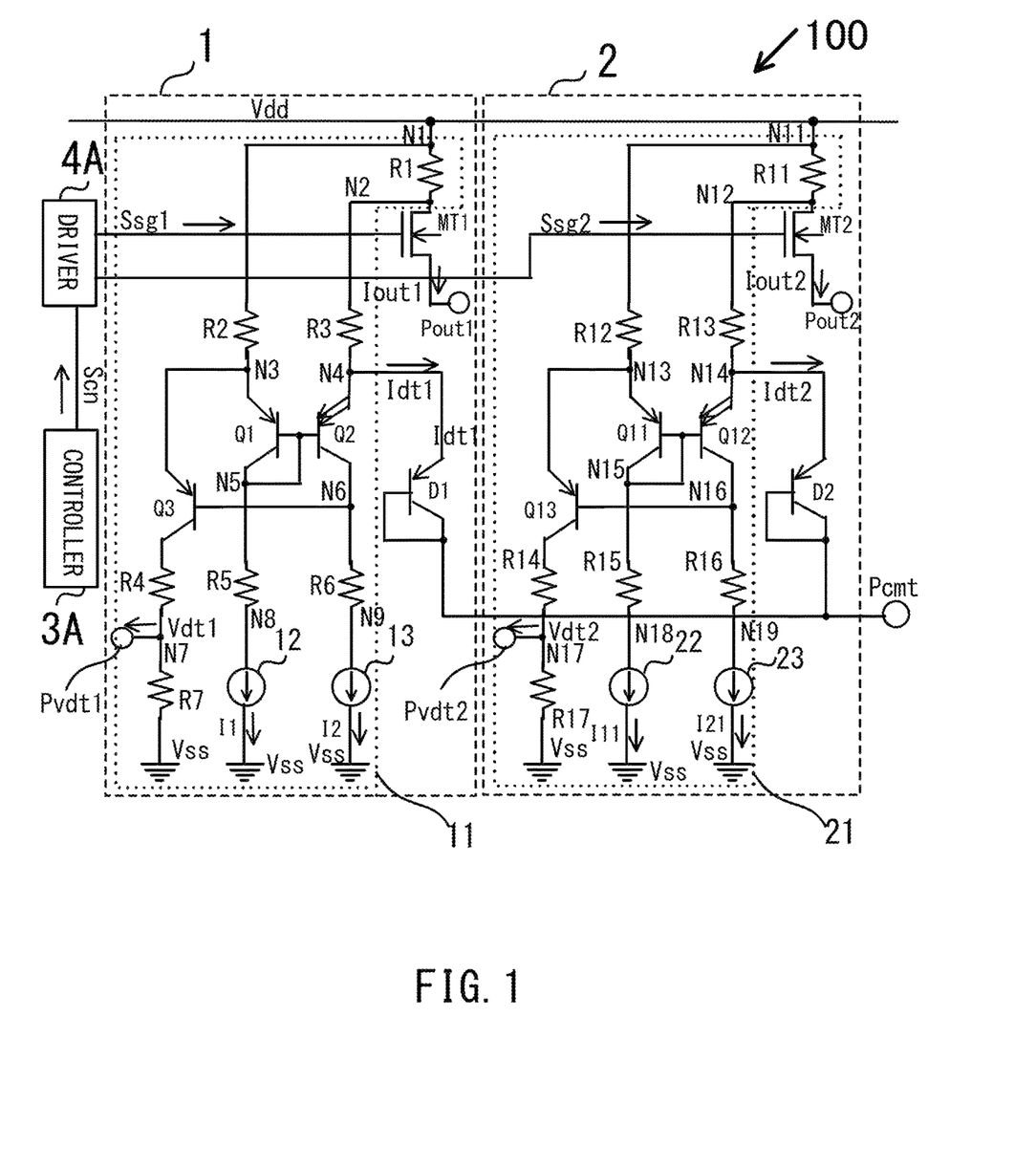
FIG. 1 is a circuit diagram showing a multichannel switch IC according to a first embodiment.

A multichannel switch IC according to a first embodiment will be described with reference to the drawings. FIG. 1 is a circuit diagram showing the multichannel switch IC.

In the first embodiment, the multichannel switch IC includes two switch circuitries and a common test terminal. Each of the two switch circuitries includes an output transistor that outputs an output signal through an output terminal, an overcurrent detection circuit that detects a detection current according to a current flowing through the output transistor and a diode having an anode that receives the detection current. The common test terminal is connected to the two switch circuitries, connected to the overcurrent detection circuit through the diode, and connected to a cathode of the diode.

As shown in FIG. 1, a multichannel switch IC 100 is a 2-channel switch IC and includes a switch circuitry 1, a switch circuitry 2, a controller 3A, a driver 4A, and a common test terminal Pcmt. The multichannel switch IC 100 is equipped with an overcurrent detection circuit as a protection function circuit for monitoring the occurrence of overcurrent to prevent abnormal operations of the switch circuitries, destruction of applications, and the like. The multichannel switch IC 100 is applied for industrial and consumer use, and is mounted in a motor control system, a battery monitoring system, a power management system, a lighting monitoring system, and the like.

The controller 3A outputs a control signal Scn that controls the operation of the driver 4A to the driver 4A. The controller 3A receives information outputted from the switch circuitries 1 and 2 during normal operation and during testing, and performs feedback control on the switch circuitries 1 and 2 based on the information (to be described in detail later).

Based on the control signal Scn, the driver 4A generates, a control signal Ssg1 for controlling the operation of an output MOS transistor MT1 in the switch circuitry 1 and a control signal Ssg2 for controlling the operation of an output MOS transistor MT2 in the switch circuitry 2.

The switch circuitries 1 and 2 have the same circuit configuration. The switch circuitry 1 includes an overcurrent detection circuit 11, a diode D1, the output MOS transistor MT1, and an output terminal Pout1.

The output MOS transistor MT1 (output transistor) is a high-side Nch output MOS transistor. The output MOS transistor MT1 has its first terminal (drain) connected to a power supply voltage (high potential side power supply) Vdd via a resistor R1, and receives the control signal Ssg1 at its control terminal (gate). Also, the output MOS transistor MT1 is turned on when the control signal Ssg1 is enabled, and outputs an output signal (output current Iout1) from its second terminal (source) side to the output terminal Pout1.

The overcurrent detection circuit 11 functions as a protection function circuit and monitors the output current Iout1 flowing through the output MOS transistor MT1. The overcurrent detection circuit 11 detects whether the output current Iout1 is within a predetermined value or is equal to or higher than the predetermined value (overcurrent). When an overcurrent of the predetermined value or more flows through the output MOS transistor MT1, the overcurrent detection circuit 11 feeds back the information to the controller 3A. The controller 3A receives the overcurrent information detected by the overcurrent detection circuit 11 to prevent heat generation or destruction of the switch circuitry 1 and heat generation or destruction of applications provided on the output side of the output terminal Pout1.

The overcurrent detection circuit 11 includes a current source 12, a current source 13, resistors R1 to R7, PNP transistors Q1 to Q3, and a detection voltage terminal Pvdt1.

The resistor R1 has its one end (node N1) connected to the power supply voltage (high potential side power supply) Vdd, and the other end (node N2) connected to the first terminal (drain) of the output MOS transistor MT1. The resistor R2 has its one end connected to the node N1 and the other end connected to a node N3. The resistor R3 has its one end connected to the node N2 and the other end connected to a node N4. The PNP transistor Q3 has its first terminal (emitter) connected to the node N3 and its control terminal (base) connected to a node N6. The resistor R4 has its one end connected to a second terminal (collector) of the PNP transistor Q3 and the other end connected to a node N7. The detection voltage terminal Pvdt1 is connected to the node N7 and outputs a detection voltage Vdt1 according to the output current Iout1, which is detected by the overcurrent detection circuit 11. The detection voltage Vdt1 is detected when the output current Iout1 flows up to the set level. The resistor R7 has its one end connected to the node N7 and the other end connected to a ground potential (low potential side power supply) Vss. The PNP transistor Q1 has its first terminal (emitter) connected to the node N3 and its control terminal (base) connected to a node N5 (second terminal, collector) and to a control terminal (base) of the PNP transistor Q2. The PNP transistor Q2 has its first terminal (emitter) connected to the node N4 and its second terminal (collector) connected to the node N6. The resistor R5 has its one end connected to the node N5 and the other end connected to a node N8. The current source 12 is provided between the resistor R5 and the ground potential (low potential side power supply) Vss, and causes a current I1 to flow toward the ground potential (low potential side power supply) Vss side. The resistor R6 has its one end connected to the node N6 and the other end connected to a node N9. The current source 13 is provided between the resistor R6 and the ground potential (low potential side power supply) Vss, and causes a current I2 to flow toward the ground potential (low potential side power supply) Vss side.

The PNP transistors Q1 and Q2 form a current mirror circuit, and cause the current I2 to flow toward the ground potential (low potential side power supply) Vss side, the current I2 being mirror-multiplied by a mirror ratio (the ratio of an emitter area of the PNP transistor Q1 to an emitter area of the PNP transistor Q2). An NPN transistor, an Nch MOS transistor, a Pch MOS transistor, and the like may be used instead of the PNP transistors Q1 and Q2 constituting the current mirror circuit.

The overcurrent detection circuit 11 outputs a detection current Idt1 via the node N2 (the other end of the resistor R1), the resistor R3, and the node N4 according to the current flowing, through the output MOS transistor MT1.

The diode D1 is a grounded base PNP transistor whose base is grounded to the collector. The diode D1 receives the detection current Idt1 at its anode, and has its cathode connected to the common test terminal Pcmt. The diode D1 is in a forward direction with respect to the detection current Idt1 and is in a backward direction with respect to a detection current Idt (detection current Idt2 in the switch circuitry 2) that is generated from the other switch circuitry (switch circuitry 2) through the common test terminal Pcmt, thus blocking the detection current Idt (detection current Idt2 in the switch circuitry 2) from entering the overcurrent detection circuit 11.

The switch circuitry 2 includes an overcurrent detection circuit 21, a diode D2, an output MOS transistor MT2, and an output terminal Pout2.

The output MOS transistor MT2 (output transistor) is a high-side Nch output MOS transistor. The output MOS transistor MT2 has its first terminal (drain) connected to a power supply voltage (high potential side power supply) Vdd via a resistor R11, and receives a control signal Ssg2 at its control terminal (gate). Also, the output MOS transistor MT2 is turned on when the control signal Ssg2 is enabled, and outputs an output signal (output current Iout2) from its second terminal (source) side to the output terminal Pout2.

The overcurrent detection circuit 21 functions as a protection function circuit and monitors the output current Iout2 flowing through the output MOS transistor MT2. The overcurrent detection circuit 21 detects whether the output current Iout2 is within a predetermined value or is equal to or higher than the predetermined value (overcurrent). When an overcurrent of the predetermined value or more flows through the output MOS transistor MT2, the overcurrent detection circuit 21 feeds back the information to the controller 3A. The controller 3A receives the overcurrent information detected by the overcurrent detection circuit 21 to prevent heat generation or destruction of the switch circuitry 2 and heat generation or destruction of applications provided on the output side of the output terminal Pout2.

The overcurrent detection circuit 21 includes a current source 22, a current source 23, resistors R11 to R17, PNP transistors Q11 to Q13, and a detection voltage terminal Pvdt2.

The resistor R11 has its one end (node N11) connected to the power supply voltage (high potential side power supply) Vdd and the other end (node N12) connected to the first terminal (drain) of the output MOS transistor MT2. The resistor R12 has its one end connected to the node N11 and the other end connected to a node N13. The resistor R13 has its one end connected to the node N12 and the other end connected to a node N14. The PNP transistor Q13 has its first terminal (emitter) connected to the node N13 and its control terminal (base) connected to a node N16. The resistor R14 has its one end connected to a second terminal (collector) of the PNP transistor Q13 and the other end connected to a node N17. The detection voltage terminal Pvdt2 is connected to the node N17 and outputs a detection voltage Vdt2 according to the output current Iout2, which is detected by the overcurrent detection circuit 21. The detection voltage Vdt2 is detected when the output current Iout2 flows up to the set level. The resistor R17 has its one end connected to the node N17 and the other end connected to a ground potential (low potential side power supply) Vss. The PNP transistor Q11 has its first terminal (emitter) connected to the node N13 and its control terminal (base) connected to a node N15 (second terminal, collector) and to a control terminal (base) of the PNP transistor Q12. The PNP transistor Q12 has its first terminal (emitter) connected to the node N14 and its second terminal (collector) connected to the node N16. The resistor R15 has its one end connected to the node N15 and the other end connected to a node N18. The current source 22 is provided between the resistor R15 and the ground potential (low potential side power supply) Vss, and causes a current I11 to flow toward the ground potential (low potential side power supply) Vss side. The resistor R16 has its one end connected to the node N16 and the other end connected to a node N19. The current source 23 is provided between the resistor R16 and the ground potential (low potential side power supply) Vss, and causes a current I21 to flow toward the ground potential (low potential side power supply) Vss side.

The PNP transistors Q11 and Q12 form a current mirror circuit, and cause the current I21 to flow toward the ground potential (low potential side power supply) Vss side, the current I21 being mirror-multiplied by a mirror ratio (the ratio of an emitter area of the PNP transistor Q11 to an emitter area of the PNP transistor Q12). An NPN transistor, an Nch MOS transistor, a Pch MOS transistor, and the like may be used instead of the PNP transistors Q11 and Q12 constituting the current mirror circuit.

The overcurrent detection circuit 21 outputs a detection current Idt2 via the node N12 (the other end of the resistor R11), the resistor R13, and the node N14 according to the current flowing through the output MOS transistor MT2.

The diode D2 is a grounded base PNP transistor whose base is grounded to the collector. The diode D2 receives the detection current Idt2 at its anode, and has its cathode connected to the common test terminal Pcmt. The diode D2 is in a forward direction with respect to the detection current Idt2 and is in a backward direction with respect to a detection current Idt (detection current Idt1 in the switch circuitry 1) that is generated from the other switch circuitry (switch circuitry 1) through the common test terminal Pcmt, thus blocking the detection current Idt (detection current Idt1 in the switch circuitry 1) from entering the overcurrent detection circuit 21.

Figure 9:
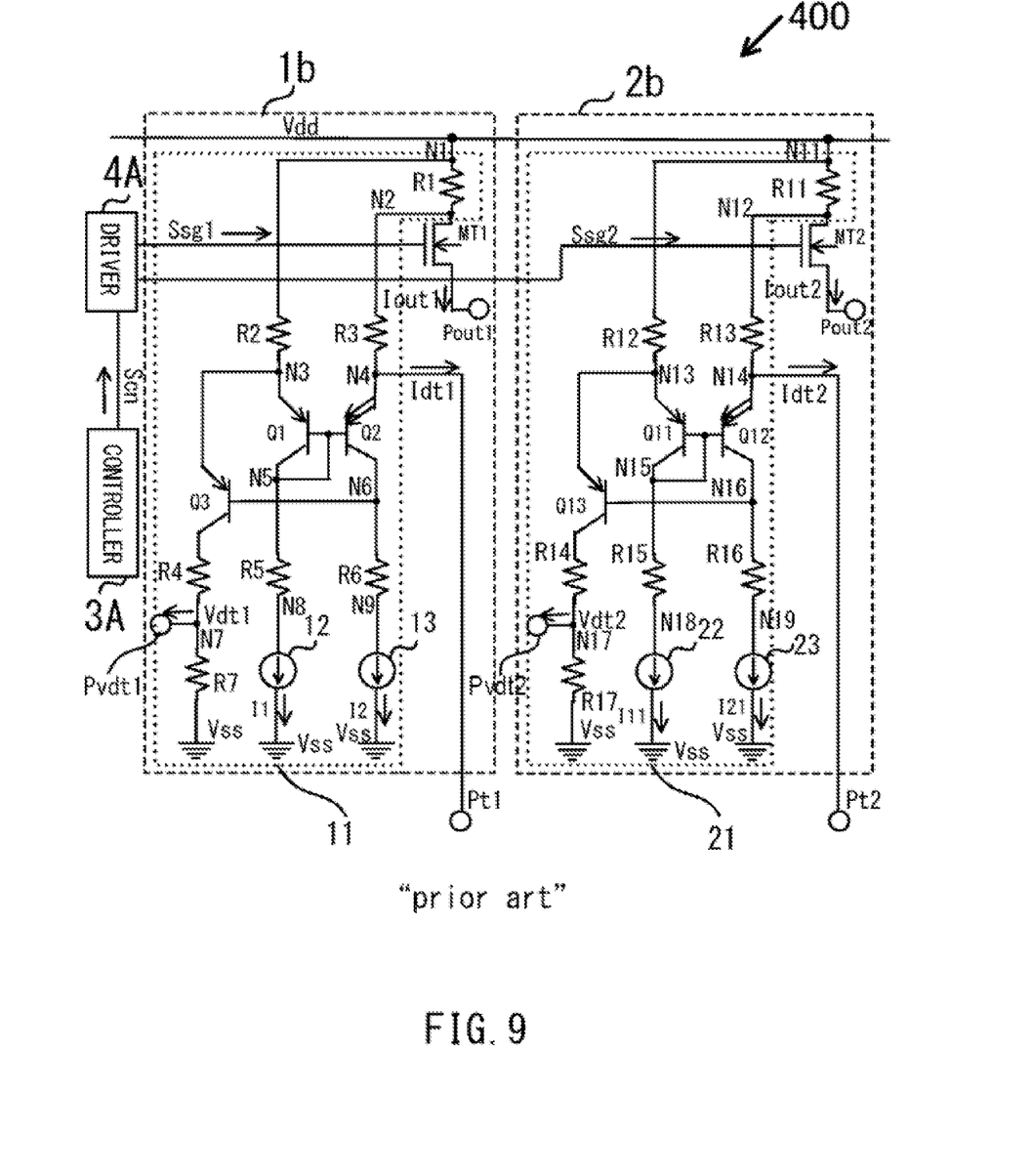
FIG. 9 is a circuit diagram showing a multichannel switch IC of a comparative example.

A multichannel switch integrated circuit (IC) of a comparative example will be described with reference to FIG. 9. As shown in FIG. 9, a multichannel switch IC 400 of the comparative example is obtained by omitting the diodes D1 and D2 from the multichannel switch IC100 of the above embodiment, and is provided with a test terminal Pt1 and a test terminal Pt2, instead of the common test terminal Pcmt. Since the multichannel switch IC 400 of the comparative example is provided with the test terminal for each switch circuitry, the number of test terminals is larger than that of the multichannel switch IC 100 of the present embodiment. In the multichannel switch IC 400 of the comparative example, only differences from the multichannel switch IC 100 of the present embodiment will be described.

A switch circuitry 1b and a switch circuitry 2b have the same circuit configuration.

The switch circuitry 1b includes an overcurrent detection circuit 11, an output MOS transistor MT1, and an output terminal Pout1. The switch circuitry 2b includes an overcurrent detection circuit 21, an output MOS transistor MT2, and an output terminal Pout2.

The test terminal Pt1 is connected to a node N4 of the overcurrent detection circuit 11 and receives a detection current Idt1. The test terminal Pt2 is connected to a node N14 of the overcurrent detection circuit 21 and receives a detection current Idt2.

Figure 2:
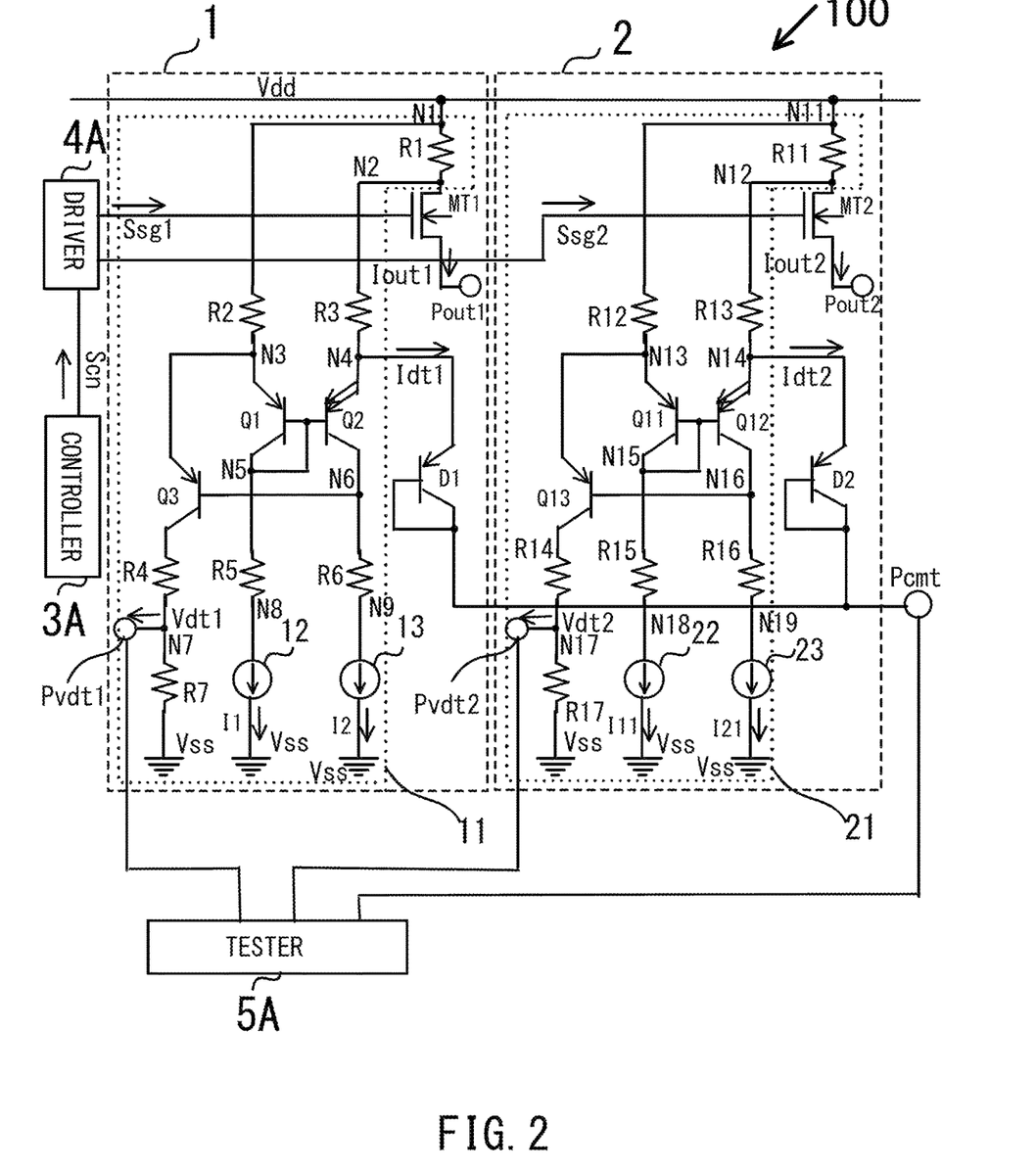
FIG. 2 is a diagram showing testing of the multichannel switch IC according to the first embodiment.
Figure 3:
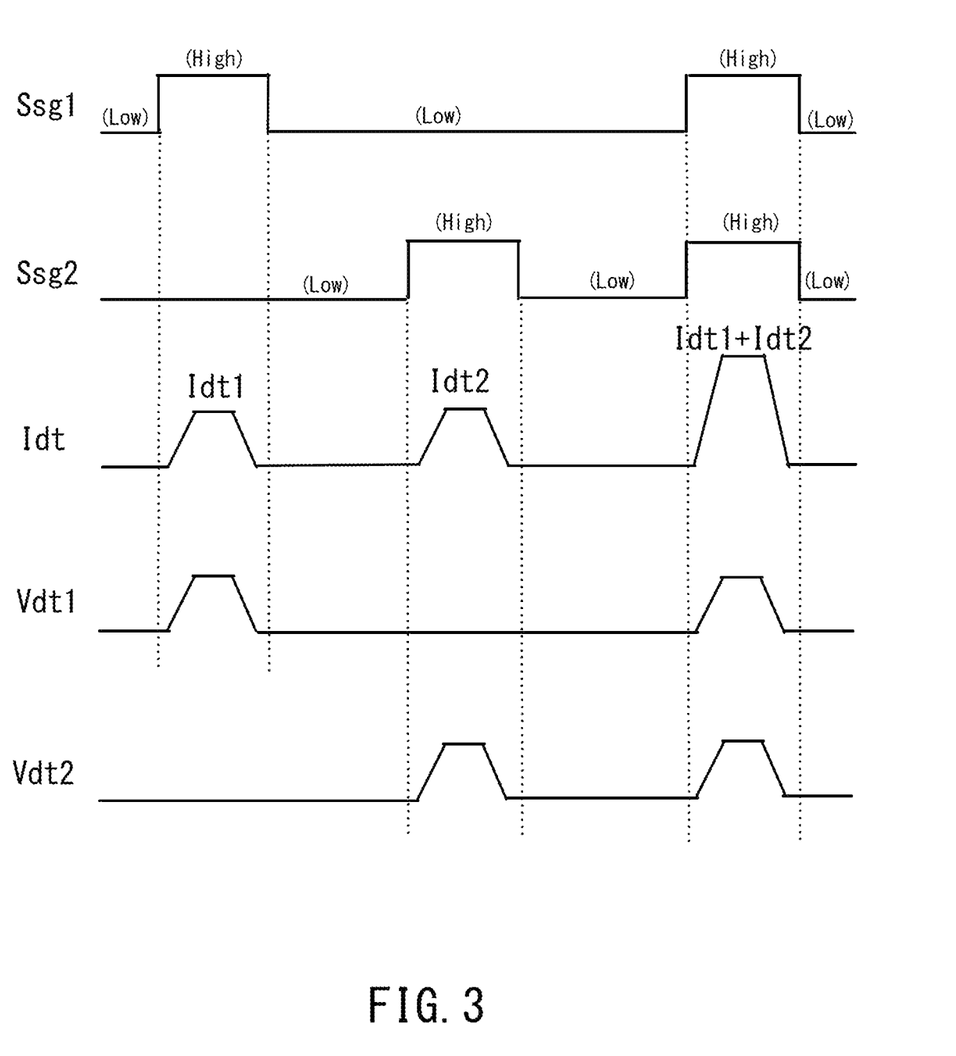
FIG. 3 is a timing chart showing the test of the multichannel switch IC according to the first embodiment.

Next, testing of the multichannel switch IC 100 will be described with reference to FIGS. 2 and 3. FIG. 2 is a diagram showing testing of the multichannel switch IC. FIG. 3 is a timing chart showing the testing of the multichannel switch IC.

As shown in FIG. 2, when testing a die sorter (D/S) of the multichannel switch IC 100, a channel switch IC module, and the like, a tester 5A uses a probe or the like to come into contact with the common test terminal Pcmt and the detection voltage terminals Pvdt1 and Pvdt2, and the like and acquires information outputted from the common test terminal Pcmt and the detection voltage terminals Pvdt1 and Pvdt2, and the like.

As shown in FIG. 3, in parallel testing (sequential testing) of the switch circuitries 1 and 2 in the multichannel switch IC 100, the control signal Ssg1 is enabled (High Level) and the control signal Ssg2 is disabled (Low Level), for example. In this process, the output MOS transistor MT1 is turned on, the output MOS transistor MT2 is turned off, the detection current Idt1 is detected through the common test terminal Pcmt according to the output current Iout1, and the detection voltage Vdt1 is detected through the detection voltage terminal Pvdt1 according to the output current Iout1. Based on the values of the detection current Idt1 and the detection voltage Vdt1, it is determined whether the output current Iout1 is within a predetermined range or outside the range (overcurrent).

Next, the control signal Ssg2 is enabled (High Level) and the control signal Ssg1 is disabled (Low Level). In this process, the output MOS transistor MT1 is turned off, the output MOS transistor MT2 is turned on, the detection current Idt2 is detected through the common test terminal Pcmt according to the output current Iout2, and the detection voltage Vdt2 is detected through the detection voltage terminal Pvdt2 according to the output current Iout2. Based on the values of the detection current Idt2 and the detection voltage Vdt2, it is determined whether the output current Iout2 is within a predetermined range or outside the range (overcurrent).

In simultaneous testing of the switch circuitries 1 and 2 in the multichannel switch IC 100, the control signal Ssg1 is enabled (High Level) and the control signal Ssg2 is enabled (High Level). In this process, the output MOS transistor MT1 is turned on, the output MOS transistor MT2 is turned on, the combined detection current (Idt1+Idt2) corresponding to the combined output current (Iout1+Iout2) is detected through the common test terminal Pont, the detection voltage Vdt1 is detected through the detection voltage terminal Pvdt1 according to the output current Iout1, and the detection voltage Vdt2 is detected through the detection voltage terminal Pvdt2 according to the output current Iout2. Based on the values of the combined detection current (Idt1+Idt2), the detection voltage Vdt1, and the detection voltage Vdt2, it is determined whether the output current Iout1 and the output current Iout2 are within a predetermined range or outside the range (overcurrent).

As described above, the multichannel switch IC 100 of the first embodiment is provided with the switch circuitries 1 and 2, the controller 3A, the driver 4A, and the common test terminal Pcmt. The switch circuitry 1 includes the overcurrent detection circuit 11, the diode D1, the output MOS transistor MT1, and the output terminal Pout1. The switch circuitry 2 includes the overcurrent detection circuit 21, the diode D2, the output MOS transistor MT2, and the output terminal Pout2. The overcurrent detection circuit 11 outputs the detection current Idt1 through the common test terminal Pcmt according to the output current Iout1 flowing through the output MOS transistor MT1. The overcurrent detection circuit 21 outputs the detection current Idt2 through the common test terminal Pcmt according to the output current Iout2 flowing through the output MOS transistor MT2.

Therefore, the number of test terminals can be reduced. As a result, it is possible to suppress increases in chip size and testing cost.

In the multichannel switch IC 100 of the embodiment, the output current flowing through the high-side output MOS transistor is monitored by using the overcurrent detection circuit. However, the embodiment is not necessarily limited to the above case. As in a multichannel switch IC 100a of a first modification shown in FIG. 8, an output current flowing through a low-side output MOS transistor may be monitored. To be more specific, the multichannel switch IC 100a is provided with a switch circuitry 1a, a switch circuitry 2a, a controller 3C, a driver 4C, and a common test terminal Pcmt.

Figure 8:
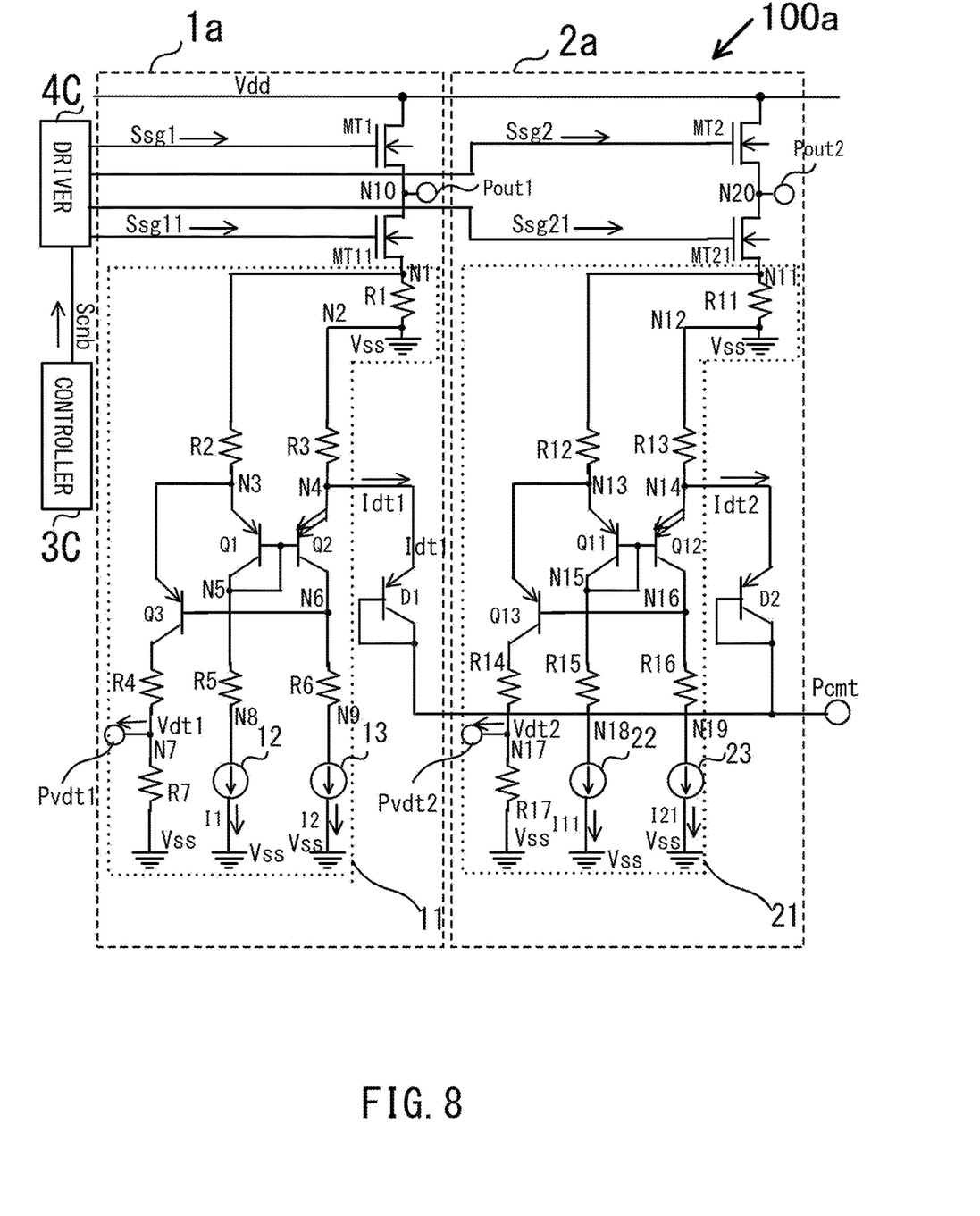
FIG. 8 is a circuit diagram showing a multichannel switch IC of a first modification.

The switch circuitry 1a includes an overcurrent detection circuit 11, a diode D1, an output MOS transistor MT1, an output MOS transistor MT11, and an output terminal Pout1. The switch circuitry 2a includes an overcurrent detection circuit 21, a diode D2, an output MOS transistor MT2, an output MOS transistor MT21, and an output terminal Pout2. Only differences from the multichannel switch IC 100 will be described below.

The controller 3C outputs a control signal Sea that controls the operation of the driver 4C to the driver 4C. The controller 3C receives information outputted from the switch circuitries 1a and 2a during normal operation and during testing, and performs feedback control on the switch circuitries 1a and 2a based on the information.

Based on the control signal Scnb, the driver 4C generates a control signal Ssg11 for controlling the operation of the output MOS transistor MT11 in the switch circuitry 1a and a control signal Ssg21 for controlling the operation of the output MOS transistor MT21 in the switch circuitry 2a.

The switch circuitries 1a and 2a have the same circuit configuration.

The output MOS transistor MT1 has its first terminal (drain) connected to a power supply voltage (high potential side power supply) Vdd, receives the control signal Ssg1 at its control terminal (gate), and has its second terminal (source) connected to a node N10 and to the output terminal Pout1. The output MOS transistor MT11 is a low-side Nch output MOS transistor having its first terminal (drain) connected to the node N10, receives the control signal Ssg11 at its control terminal (gate), and has its second terminal (source) connected to the node N1. Also, the output MOS transistor MT11 is turned on when the control signal Ssg11 is enabled (High Level) and is turned off when the control signal Ssg11 is disabled (Low Level). The overcurrent detection circuit 11 outputs a detection current and a detection voltage according to the current flowing through the output MOS transistor MT11.

The output MOS transistor. MT2 has its first terminal (drain) connected to a power supply voltage (high potential side power supply) Vdd, receives the control signal Ssg2 at its control terminal (gate), and has its second terminal (source) connected to a node N20 and to the output terminal Pout2. The output MOS transistor MT21 is a low-side Nch output MOS transistor having its first terminal (drain) connected to the node N20, receives the control signal Ssg21 at its control terminal (gate), and has its second terminal (source) connected to the node N11. Also, the output MOS transistor MT21 is turned on when the control signal Ssg21 is enabled (High Level) and is turned off when the control signal Ssg21 is disabled (Low Level). The overcurrent detection circuit 21 outputs a detection current and a detection voltage according to the current flowing through the output MOS transistor MT21.

Figure 4:
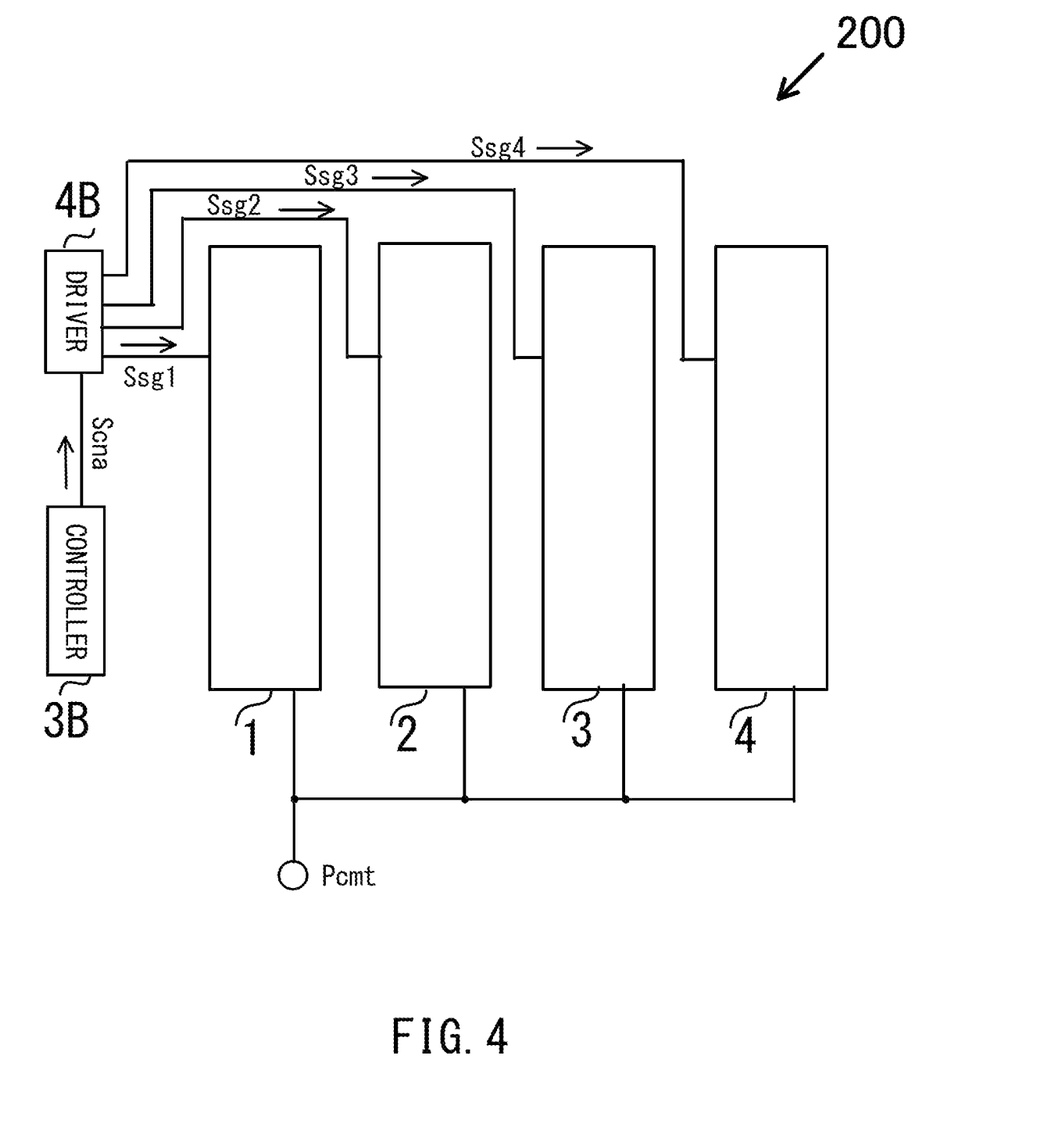
FIG. 4 is a circuit diagram showing a multichannel switch IC according to a second embodiment.

A multichannel switch IC according to a second embodiment will be described with reference to the drawings. FIG. 4 is a circuit diagram showing the multichannel switch IC.

In the second embodiment, the multichannel switch IC includes four switch circuitries and a common test terminal. The four switch circuitries each include an output transistor that outputs an output signal through an output terminal, an overcurrent detection circuit that detects a detection current according to a current flowing through the output transistor and a diode that receives the detection current at its anode. The common test terminal is connected to the four switch circuitries, connected to the overcurrent detection circuit through the diode, and connected to a cathode of the diode.

Hereinafter, the same portions as those in the first embodiment are denoted by the same reference numerals, and description thereof will be omitted. Only differences will be described below.

As shown in FIG. 4, a multichannel switch IC 200 is a 4-channel switch IC, and includes switch circuitries 1 to 4 and a common test terminal Pcmt. The multichannel switch IC 200 is equipped with an overcurrent detection circuit that monitors the occurrence of overcurrent to prevent abnormal operation of the switch circuitries, destruction of applications, and the like. The multichannel switch IC 200 is applied for industrial and consumer use, and is mounted in a motor control system, a battery monitoring system, a power management system, a lighting monitoring system, and the like.

A controller 3B outputs a control signal Scna that controls the operation of a driver 4B to the driver 4B. The controller 3B receives information outputted from the switch circuitries 1 to 4 during normal operation and during testing, and performs feedback control on the switch circuitries 1 to 4 based on the information.

Based on the control signal Scna, the driver 4B generates a control signal Ssg1 for controlling the operation of an output MOS transistor (not shown) in the switch circuitry 1, a control signal Ssg2 for controlling the operation of an output MOS transistor (not shown) in the switch circuitry 2, a control signal Ssg3 for controlling the operation of an output MOS transistor (not shown) in the switch circuitry 3, and a control signal Ssg4 for controlling the operation of an output MOS transistor (not shown) in the switch circuitry 4.

The switch circuitries 1 to 4 have the same circuit configuration.

An overcurrent detection circuit (not shown) provided in the switch circuitry 3 detects a detection current and a detection voltage according to an output current flowing through the output MOS transistor (not shown). An overcurrent detection circuit (not shown) provided in the switch circuitry 4 detects a detection current and a detection voltage according to an output current flowing through the output MOS transistor (not shown).

The detection current outputted from the overcurrent detection circuit (not shown) in the switch circuitry 3 is inputted to the common test terminal Pcmt through a diode (not shown), while the detection current outputted from the overcurrent detection circuit (not shown) in the switch circuitry 4 is inputted to the common test terminal Pcmt through a diode (not shown).

As described above, the multichannel switch IC 200 of the second embodiment is provided with the switch circuitries 1 to 4 and the common test terminal Pcmt. The switch circuitries 1 to 4 have the same circuit configuration. The detection currents outputted from the switch circuitries 1 to 4 are inputted to the common test terminal Pcmt via the diodes.

Therefore, the number of test terminals can be reduced. As a result, it is possible to suppress increases in chip size and testing cost.

The multichannel switch IC of the embodiment has a 4-channel configuration, but the embodiment is not necessarily limited to the above case. For example, a configuration with three channels, five channels or more is also applicable.

Figure 5:
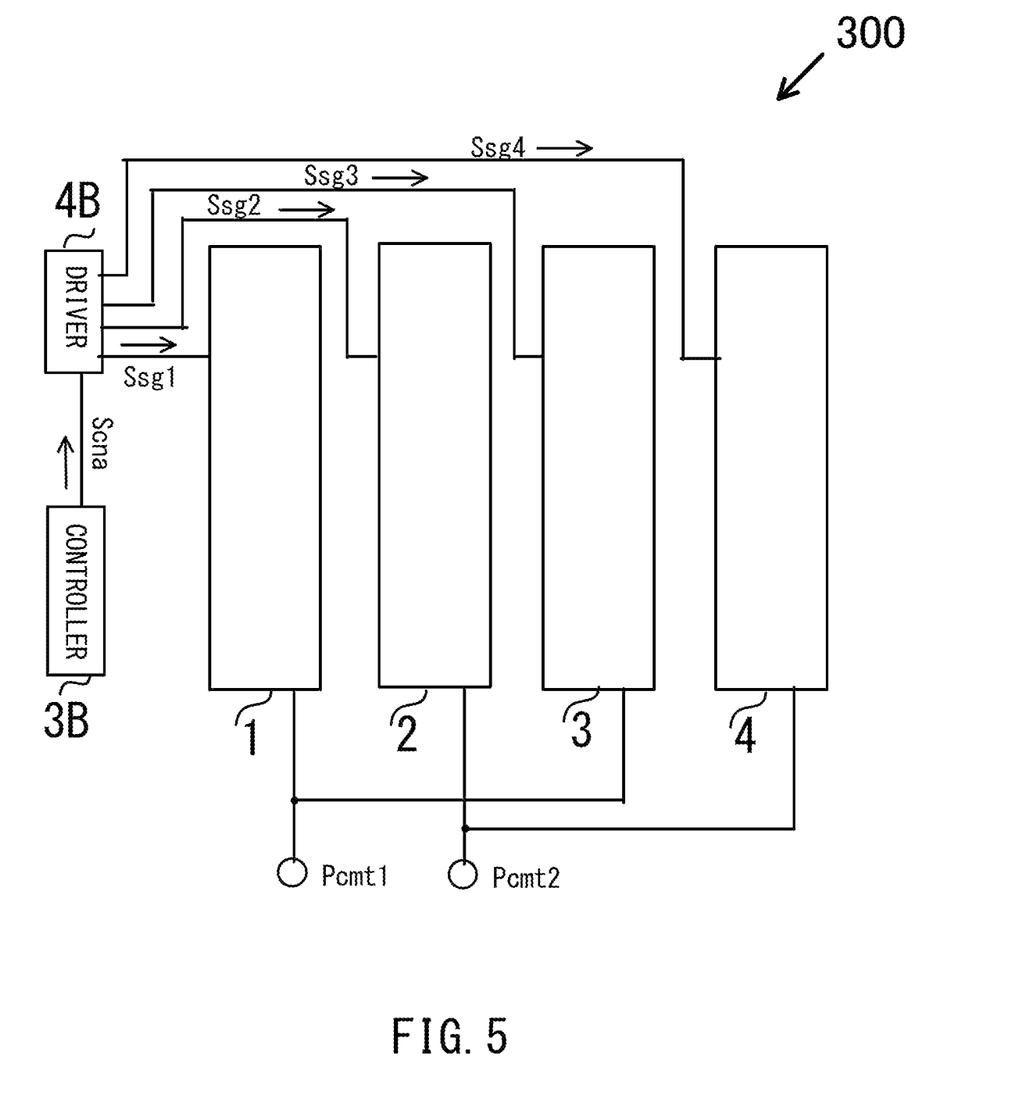
FIG. 5 is a circuit diagram showing a multichannel switch IC according to a third embodiment.

A multichannel switch IC according to a third embodiment will be described with reference to the drawings. FIG. 5 is a circuit diagram showing the multichannel switch IC.

In the third embodiment, the multichannel switch IC includes four switch circuitries, a first common test terminal, and a second common test terminal. The four switch circuitries each include an output transistor that outputs an output signal through an output terminal, an overcurrent detection circuit that detects a detection current according to a current flowing through the output transistor and a diode that receives the detection current at its anode. The first common test terminal is connected to the odd-numbered switch circuitries, connected to the overcurrent detection circuit through the diode, and connected to a cathode of the diode. The second common test terminal is connected to the even-numbered switch circuitries, connected to the overcurrent detection circuit through the diode, and connected to the cathode of the diode.

Hereinafter, the same portions as those in the second embodiment are denoted by the same reference numerals, and description thereof will be omitted. Only differences will be described below.

As shown in FIG. 5, a multichannel switch IC 300 is a 4-channel switch IC, and includes switch circuitries 1 to 4, a common test terminal Pcmt1, and a common test terminal Pcmt2. The multichannel switch IC 300 is equipped with overcurrent detection circuits that monitor the occurrence of overcurrent to prevent abnormal operation of the switch circuitries, destruction of applications, and the like. The multichannel switch IC 300 is applied for industrial and consumer use, and is mounted in a motor control system, a battery monitoring system, a power management system, a lighting monitoring system, and the like.

The common test terminal Pcmt1 (first common test terminal) is connected to the switch circuitries 1 and 3, which are each of the odd-numbered switch circuitries, is connected to the overcurrent detection circuit through a diode, and is connected to a cathode of the diode. The common test terminal Pcmt2 (second common test terminal) is connected to the switch circuitries 2 and 4, which are each of the even-numbered switch circuitries, is connected to the overcurrent detection circuit through a diode, and is connected to a cathode of the diode.

Figure 6:
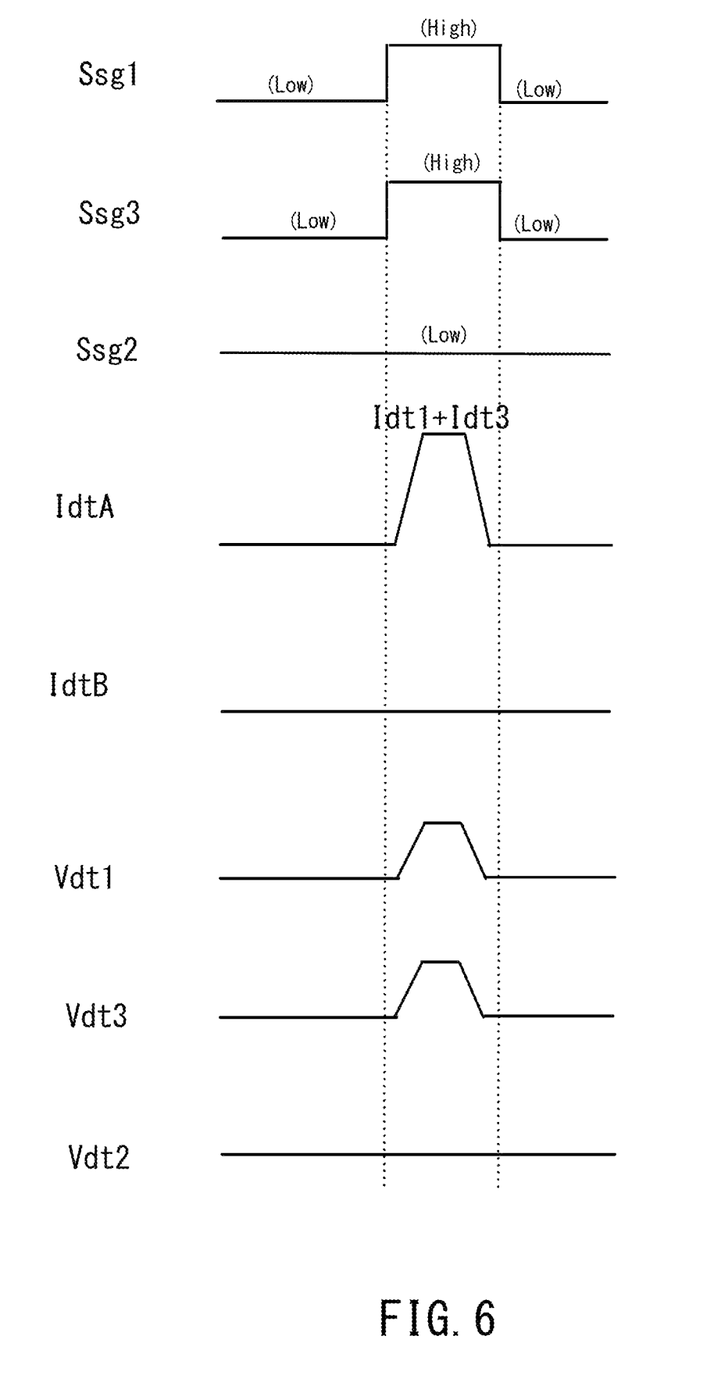
FIG. 6 is a timing chart showing testing of the multichannel switch IC according to the third embodiment.
Figure 7:
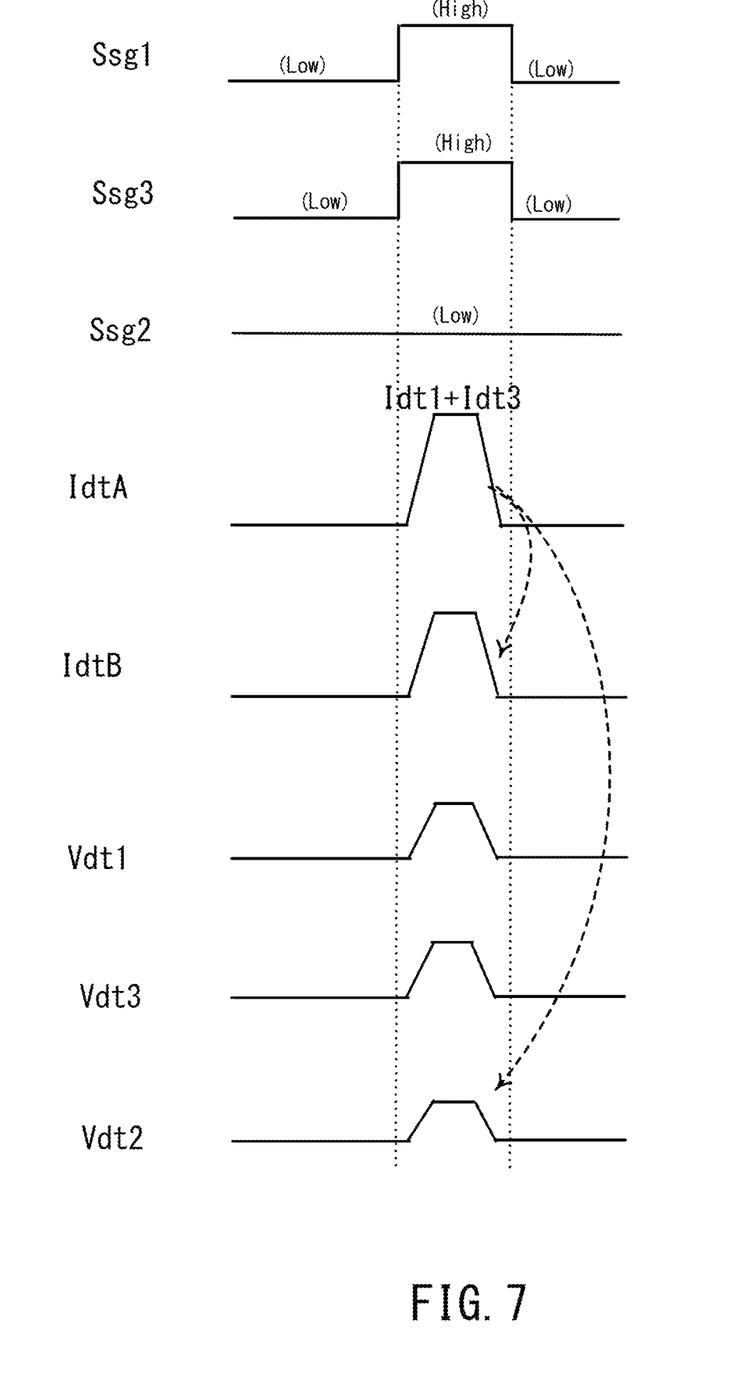
FIG. 7 is a timing chart showing the testing of the multichannel switch IC according to the third embodiment.

Next, testing of the multichannel switch IC 300 will be described with reference to FIGS. 6 and 7. FIGS. 6 and 7 are timing charts showing the testing of the multichannel switch IC. FIG. 6 is a timing chart when there is no influence of noise due to adjacent channels. FIG. 7 is a timing chart when there is an influence of noise clue to adjacent channels.

As shown in FIG. 6, when the output MOS transistors in the odd-numbered switch circuitries (switch circuitries 1 and 3) are simultaneously turned on, combined detection current (Idt1+Idt3) is detected at the common test terminal Pcmt1 (first common test terminal) according to combined output current (Iout1+Iout3), a detection voltage Vdt1 is detected according to the output current Iout1, and a detection voltage Vdt3 is detected according to the output current Iout3, for example, no detection voltage is observed at the detection voltage terminal (for example, the detection voltage terminal Pvdt2) if noise such as a parasitic operating current does not occur in the even-numbered switch circuitry that is not turned on (for example, the switch circuitry 2 arranged between the switch circuitries 1 and 3).

As shown in FIG. 7, when the output MOS transistors in the odd-numbered switch circuitries (switch circuitries 1 and 3) are simultaneously turned on, the combined detection current (Idt1+Idt3) is detected at the common test terminal Pcmt1 (first common test terminal) according to the combined output current (Iout1+Iout3), the detection voltage Vdt1 is detected according to the output current Iout1, and the detection voltage Vdt3 is detected according to the output current Iout3, for example, a detection voltage is observed at the detection voltage terminal (for example, the detection voltage terminal Pvdt2) if noise such as a parasitic operating current occurs due to parasitic operation of circuits included in the even-numbered switch circuitry that is not turned on.

To be more specific, when the detection voltage is observed only in the even-numbered switch circuitry 2, it is considered that noise has occurred only in the even-numbered switch circuitry 2 arranged between the odd-numbered switch circuitries 1 and 3.

Alternatively, when the detection voltage is observed in the even-numbered switch circuitries 2 and 4, it is considered that noise has occurred in the even-numbered switch circuitry 2 arranged between the odd-numbered switch circuitries 1 and 3 and in the even-numbered switch circuitry 4 arranged adjacent to the switch circuitry 3.

By providing the odd-numbered common test terminal Pcmt1 and the even-numbered common terminal Pcmt2, it is possible to check if there is mutual interference and noise between channels in adjacent switch circuitries in the multichannel switch IC.

As described above, the multichannel switch IC 300 of the third embodiment is provided with the switch circuitries 1 to 4 and the common test terminals Pcmt1 and Pcmt2. The common test terminal Pcmt1 is connected to the switch circuitries 1 and 3, which are each of the odd-numbered switch circuitries, is connected to the overcurrent detection circuit through the diode, and is connected to the cathode of the diode. The common test terminal Pcmt2 is connected to the switch circuitries 2 and 4, which are each of the even-numbered switch circuitries, is connected to the overcurrent detection circuit through the diode, and is connected to the cathode of the diode. In the testing of the multichannel switch IC 300, it is checked if there are detection currents and detection voltages in the even-numbered switch circuitries in a state where the output MOS transistors in the odd-numbered switch circuitries are simultaneously turned on and the output MOS transistors in the even-numbered switch circuitries are turned off. Alternatively, it is checked if there is mutual interference or noise between channels in adjacent switch circuitries by checking if there are detection currents and detection voltages in the odd-numbered switch circuitries in a state where the output MOS transistors in the even-numbered switch circuitries are simultaneously turned on and the output MOS transistors in the odd-numbered switch circuitries are turned off.

Therefore, it is possible to efficiently check if there is mutual interference and noise between channels in adjacent switch circuitries while reducing the number of test terminals.

While certain embodiments have been described, these embodiments have been presented by way of example only, and are nota intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multichannel switch integrated circuit comprising:
a multichannel switch circuit provided with three or more switch circuitries, each including an output transistor that outputs an output signal through an output terminal, an overcurrent detection circuit that detects a detection current according to a current flowing through the output transistor, and a diode that receives the detection current at an anode of the diode; and
a first common test terminal connected to a cathode of the diode provided in odd-numbered switch circuitries of the multichannel switch circuit; and
a second common test terminal connected to a cathode of the diode provided in an even-numbered switch circuitry of the multichannel switch circuit.

2. The multichannel switch integrated circuit according to claim 1, wherein
the overcurrent detection circuit outputs a detection voltage according to the current flowing through the output transistor through a detection voltage terminal.

3. The multichannel switch integrated circuit according to claim 1, wherein
the output transistor is a high-side output MOS transistor.

4. The multichannel switch integrated circuit according to claim 1, wherein
the overcurrent detection circuit includes a first resistor having one end connected to a power supply and the other end connected to a first terminal of the output transistor, and
the overcurrent detection circuit detects the detection current from the other end side of the first resistor, and detects the detection voltage according to the current flowing through the first resistor.

5. The multichannel switch integrated circuit according to claim 1, wherein
the output transistor is a low-side output MOS transistor.

6. The multichannel switch integrated circuit according to claim 1, wherein
during testing of the multichannel switch circuit, the overcurrent detection circuit checks if there is any influence of noise on the even-numbered switch circuitries from the odd-numbered switch circuitries when simultaneously turning on the output transistors in the odd-numbered switch circuitries and turning off the output transistors in the even-numbered switch circuitries, and also checks if there is any influence of noise on the odd-numbered switch circuitries from the even-numbered switch circuitries when turning off the output transistors in the odd-numbered switch circuitries and simultaneously turning on the output transistors in the even-numbered switch circuitries.

7. The multichannel switch integrated circuit according to claim 1, wherein
the diode is a PNP transistor whose base is tied to its collector.

8. The multichannel switch integrated circuit according to claim 1, wherein
the multichannel switch integrated circuit is applied to at least one of a motor control system, a battery monitoring system, a power management system, and a lighting monitoring system.

* * * * *